United States Patent [19] [11] 4,197,125
Ohkawa et al. [45] Apr. 8, 1980

[54] PROCESS OF MAKING PHOTOSENSITIVE RESIN PRINTING PLATES

[75] Inventors: Kazumi Ohkawa; Akihiro Horike, both of Hino; Teruo Takahashi, Kunitachi; Tadashi Shingu, Hino, all of Japan

[73] Assignee: Teijin Limited, Osaka, Japan

[21] Appl. No.: 865,217

[22] Filed: Dec. 28, 1977

Related U.S. Application Data

[63] Continuation of Ser. No. 736,144, Oct. 27, 1976, abandoned, which is a continuation-in-part of Ser. No. 548,072, Jan. 7, 1975, abandoned.

[30] Foreign Application Priority Data

Feb. 12, 1974 [JP] Japan .................................... 49-16314
Feb. 20, 1974 [JP] Japan .................................... 49-19375

[51] Int. Cl.$^2$ .............................................. G03C 5/00
[52] U.S. Cl. .................................... 430/306; 430/514; 430/524; 430/275
[58] Field of Search ................... 96/35.1, 84 R, 86 P, 96/87 R, 115 P; 260/75 NK

[56] References Cited

U.S. PATENT DOCUMENTS

| | | | |
|---|---|---|---|
| 3,462,267 | 8/1969 | Giangualano et al. | 96/35.1 |
| 3,645,772 | 2/1972 | Jones | 96/36.2 |
| 3,820,993 | 6/1974 | Lewis et al. | 96/35.1 |
| 3,861,921 | 1/1975 | Hoffmann et al. | 96/35.1 |
| 3,873,316 | 3/1975 | Velpen et al. | 96/86 P |
| 3,960,572 | 6/1976 | Ibata et al. | 96/115 P |
| 4,079,159 | 3/1978 | Sano et al. | 96/35.1 |

*Primary Examiner*—Jack P. Brammer
*Attorney, Agent, or Firm*—Sherman & Shalloway

[57] ABSTRACT

A support convenient for preparing a printing plate in situ using a liquid photosensitive resin of an unsaturated polyurethane resin is disclosed. This support consists of a base plate and coated thereon a layer of a composition consisting of a mercapto-containing ester obtained by polycondensing a thiocarboxylic acid or thioalcohol with a polyglycol or polycarboxylic acid or an aromatic tertiary amine and a polymer binder. The support of this invention, which has a broadened base of a sectionally trapezoidal configuration, provides a relief image that is firmly adhered to the support.

6 Claims, No Drawings

PROCESS OF MAKING PHOTOSENSITIVE RESIN PRINTING PLATES

This is a continuation of application Ser. No. 736,144, filed Oct. 27, 1976, which in turn is a continuation-in-part of application Ser. No. 548,072 filed Jan. 7, 1975, both now abandoned.

This invention relates to a support for a printing plate prepared from a liquid photosensitive resin. More specifically, this invention relates to a support for a printing plate prepared from a liquid photosensitive resin which can give relief images having a desirable shape.

Photopolymerizable unsaturated polyurethane resin compositions useful for producing relief printing plates have been known, and it has also been known that such a photopolymerizable composition can be laminated on a support in the form of sheet or plate, and exposed to actinic light to cause crosslinkage and form relief images.

Generally, the above support includes a antihalation layer and an adhesive layer. When a photosensitive resin composition is laminated on the support, and exposed to actinic light through a negative film bearing transparent images, the photosensitive resin composition near the support is difficult to crosslink because the amount of actinic light reaching it is small. Accordingly, it is difficult to obtain relief images having a desirable shape (with a cross section being of a frustoconical shape with a broadened bottom).

With a view to removing such a defect, Japanese Patent Publication No. 1306/62, for example, discloses a method in which the sensitivity of the photosensitive resin in the solid photosensitive resin composition is increased at portions nearer the support, thereby to promote a crosslinking reaction.

This method, however, requires a complicated procedure, and is not feasible. Furthermore, since according to this method, two photosensitive layers are prepared using a photosensitive resin which is solid in the unexposed state, the method cannot be applied to plate-making using a liquid photosensitive resin.

Accordingly, it is an object of this invention to provide a support for a printing plate using a photosensitive unsaturated polyurethane resin, by the use of which a printing plate having reliefs made by the photopolymerization and curing of the liquid photosensitive unsaturated polyurethane resin can be made in situ, and the reliefs have a good frustoconical cross section with a broadened bottom.

Another object of this invention is to provide a support for a printing plate using a liquid photosensitive unsaturated polyurethane resin, by the use of which reliefs having superior resistance to scratch and printing can be prepared in situ from the liquid photosensitive resin.

We have made extensive investigations with a view to achieving the objects of this invention, and found that if a support is prepared by providing an activating layer of a specific composition on a base plate, the photopolymerization and crosslinking reaction of the photosensitive resin composition is promoted near the support, that is, at the place where the amount of actinic light is small, and relief images having a satisfactory shape can be formed.

According to this invention, there is provided a support for a printing plate, using a liquid photosensitive resin composition comprising at least one unsaturated polyurethane resin selected from the group consisting of an unsaturated polyurethane resin obtained by reacting a hydroxyl-terminated unsaturated polyester with an organic polyisocyanate and an unsaturated polyurethane resin obtained by reacting a reaction product of a hydroxyl-terminated polyester or polyether and an organic polyisocyanate, with a compound of the formula

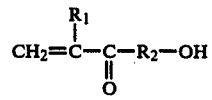

wherein $R_1$ is either hydrogen or methyl, and $R_2$ represents

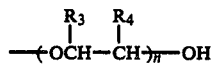

where $R_3$ and $R_4$ are each either hydrogen or an alkyl group of 1-3 carbon atoms, which may be substituted by a halogen, a vinyl monomer and a photopolymerization initiator, the support comprising (1) a base plate for supporting a layer of the liquid photosensitive resin, and (2) formed on that surface of the base plate which supports the liquid photosensitive resin layer, an activating layer consisting essentially of a compound containing at least one mercapto group in the molecule and/or an aromatic tertiary amine and a polymer binder soluble in an organic solvent.

A novel aspect of this invention is that an activating layer composed of a polymer binder soluble in an organic solvent and a mercapto-containing compound and/or an aromatic tertiary amine is provided on a base plate.

The above activating layer of this invention appears to act on that part of a liquid photosensitive resin layer applied thereon which is near the support, and reliefs of good shape can be obtained probably because the photosensitive resin in that area is more strongly activated than the photosensitive resin farther from the support. The invention, however, is not limited in any way by such a theory.

The thickness of the activating layer is not always critical, but is preferably 0.1 to 50 microns, more preferably 1 to 7 microns.

The polymer binder is a linear polymer soluble in ordinary organic solvents, and especially preferably, it is soluble in wash-out solutions for the photosensitive resin compositions.

Examples of such polymer binders are polystyrene, an ethylene/vinyl acetate copolymer, polycarbonate, polyvinyl acetate, polyamides, polyurethane, polyesters, poly(acrylic acid esters), poly(methacrylic acid esters), acetates, ethyl cellulose, methyl cellulose, and hydroxypropyl cellulose. In order to form an activating layer which ensures a better adhesion between the support and the photosensitive resin, polymers containing carboxyl groups and being soluble in aqueous alkali solutions are especially preferred. Specific examples of such polymers are copolymers of acrylic acid or methacrylic acid with acrylic acid esters or methacrylic acid esters or other vinyl monomers, copolymers of maleic anhydrides and various olefins (for example, methyl vinyl ether or styrene) or their alcohol-modified products, cellulose acetate phthalate, cellulose acetate succinate, hydroxypropyl cellulose phthalate, hydroxypropyl methyl cellulose phthalate, and succinic acid- or phthalic acid-modified products of polyvinyl alcohol. These polymer binders can be used either alone or in combination of two or more.

The above preferred types of polymer binder are especially suitable when the liquid photosensitive resin based on an unsaturated polyester is used as a photosensitive resin for forming reliefs.

Examples of compounds containing at least one mercapto group in the molecule to be used conjointly with the polymer binder are thiocarboxylic acids such as thioglycolic acid, β-mercaptopropionic acid or α-mercaptopropionic acid, thiophenols such as thiophenol or thiosalicyclic acid, thioalcohols such as β-mercaptoethanol or α-mercaptopropanol, and compounds derived from the above compounds. Of these, esters containing mercapto groups bonded to aliphatic carbons obtained by condensing thiocarboxylic acids or alcohols containing mercapto groups bonded to aliphatic carbons with polycarboxylic acids or polyglycols are especially effective. Examples of suitable esters include bis-thioglycolic acid ethylene glycol ester, bis-(β-mercaptopropionic acid) ethylene glycol ester, tris-thioglycolic acid trimethylolpropane ester, tetrakisthioglycolic acid pentaerythritol ester, tetrakis-(β-mercaptopropionic acid) pentaerythritol ester, a condensation product drived from β-thioglycolic acid, diethylene glycol and adipic acid (with a molar ratio of 1:2:1), a condensation product drived from β-thioglycolic acid, diethylene glycol and adipic acid (with a molar ratio of 2:2:1), a polyester derived from thioglycolic acid, trimethylol propane and diethylene glycol adipic acid (with a molar ratio of 1:1:1), a polyester derived from thioglycolic acid, pentaerythritol and adipic acid (with a molar ratio of 6:2:1), a polyester obtained by reacting thioglycolic acid and/or β-mercaptopropionic acid and polycarboxylic acid and polyglycolic acid, and a polyester obtained by reacting a thioalcohol such as β-mercaptoethanol and a polycarboxylic acid and a polyglycolic acid.

It is effective to use a double bond-containing compound having weak reactivity, such as tetrahydrophthalic acid, as a dicarboxylic acid component of the above polyester. These mercapto-containing compounds can be used either alone or in combinations of two or more.

The aromatic tertiary amine compound forming the activating layer in conjunction with the above polymer binder is a compound containing at least one tertiary amino group in the molecules wherein at least one of the substituents thereof is an aromatic ring. Examples of the aromatic tertiary amino include N,N-dialkylated products of aromatic monoamines or their derivatives, for example, N,N-dialkylated products of aniline such as N,N-dimethylaniline, N,N-diethylaniline, N,N-dipropylaniline or N,N-dibutylaniline, N,N-dialkylated products of toluidine such as N,N-dimethyl-o-toluidine, N,N-dimethyl-m-toluidine or N,N-dimethyl-p-toluidine, or N,N-dialkylated products of naphthylamine such as N,N-dimethyl-naphthylamine or N,N-diethyl-naphthylamine; products obtained by alkylating all amino groups of aromatic polyamines or their derivatives such as o-phenylenediamine, m-phenylenediamine, p-phenylenediamine, diaminonaphthalene or triaminonaphthalene; N,N-di(hydroxyalkyl) substituted products or N-alkyl-N-hydroxyalkyl substituted products of aromatic amines such as N,N-di(β-hydroxyethyl)-aniline, N,N-di(β-hydroxyethyl)-m-toluidine or N-ethyl-N-(β-hydroxyethyl)-toluidine; diaryl-substituted tertiary amines such as diphenylmethylamine or diphenylethylamine, and triaryl-substituted tertiary amines such as triphenylamine. Of these, the aniline and toluidine derivatives are especially preferred. These aromatic tertiary amine compounds can be used either alone or in combinations of two or more.

The ratio of the mercapto-containing compound and/or aromatic tertiary amine compound to the polymer binder is such that the amount of the mercapto-containing compound and/or aromatic tertiary amine compound is 0.05 to 2, perferably 0.1 to 1, times the weight of the polymer binder. If the amount is less than 0.05 times, the effect of the activating layer is not sufficient, and if it exceeds 2 times, the support itself becomes tacky, or the mercapto-containing compound and/or aromatic tertiary amine compound precipitates.

The activating layer in accordance with this invention can contain various additives, such as an anti-halation agent or plasticizer, in addition to the above polymeric binder the mercapto-containing compound and/or the aromatic tertiary amine compound.

Preferably, the amount of such additives is not more than 1.0 times the total weight of the mercapto-containing compound and/or aromatic tertiary amine compound and polymer binder. If it is larger than this amount, the effect of the activating layer is markedly impaired, and the relief images have poor adhesion.

When the above activating layer is applied to a base plate, the mercapto-containing compound and/or aromatic tertiary amine compound and polymer binder (and if desired, additives) are dissolved in a solvent, and applied to the base plate in a suitable thickness using such means as gravure coating, roll coating, spray coating or bar coating.

The base plate used in this invention can be various metal plate such as iron, stainless steel, zinc or aluminum, rubber sheets (e.g., synthetic rubbers), or films such as Celluloid, polyethylene, polypropylene or polyethylene terephthalate films.

In order to prepare a relief printing plate by laminating the photosensitive resin on the support and exposing it to actinic light through a negative film bearing a transparent image, an adhesive layer and an anti-halation layer are usually provided on the support. These adhesive and antihalation layers can either be a single integrated layer or two separate layers. The anti-halation layer is a layer which can absorb at least 30% of the actinic light that arrives at the suport, and generally contains an inorganic pigment such as red lead or red iron oxide, an organic pigment such as Hansa Yellow 3G, or an ultraviolet absorber such as Tinuvin 327. The adhesive layer contains a resin for firmly bonding the relief layer and the support, which is selected from polyurethane resins, epoxy resins, polyester resins, polyamide resins, and modified products of these according to their suitability for forming reliefs.

It is effective to provide the activating layer on the above adhesive layer and/or anti-halation layer formed on the base plate. Provision of the adhesive layer and/or anti-halation layer is not altogether necessary in the present invention.

The liquid photosensitive unsaturated polyurethane resin composition that is laminated onto the support of the present invention is composed of an unsaturated polyurethane resin containing in its molecule an ethylenic double bond and an urethane bond, a vinyl monomer (crosslinking agent) and a photopolymerization initiator. Photosensitive resin composition of this kind are disclosed in Japanese Laid-Open Patent Application Nos. 84855/73, 47538/73 and 41706/73.

The foregoing unsaturated polyurethane resins can be roughly classified into the following two classes: (1)

Unsaturated polyurethane resins obtained by reacting a hydroxyl-terminated unsaturated polyester with an organic polyisocyanate; and (2)

Unsaturated polyurethane resins obtained by reacting a reaction product of a hydroxyl-terminated polyester or polyether and an organic polyisocyanate, with a compound of the formula

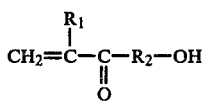

wherein $R_1$ is either hydrogen or methyl, and $R_2$ represents

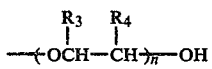

where $R_3$ and $R_4$ are each either hydrogen or an alkyl group of 1–3 carbon atoms, which may be substituted by a halogen.

Examples of the unsaturated polyurethane resins of the type indicated in (1), above, are those obtained by reacting a hydroxyl-terminated unsaturated polyester obtained by polycondensing a glycol component such as ethylene glycol, propylene glycol or diethylene glycol and an acid component consisting of such unsaturated dicarboxylic acids as maleic anhydride, fumaric acid or itaconic acid and, as the case may be, such saturated carboxylic acids as adipic acid, phthalic acid or trimellitic acid, with an organic diisocyanate compound such, for example, as tolylene diisocyanate, diphenylmethane diisocyanate, hexamethylene diisocyanate, isophorone diisocyanate or m-xylylene diisocyanate.

The unsaturated polyurethane resin of the type indicated in (2), above, are exemplified by those obtained by reacting a hydroxyl-terminated polyester or polyester, e.g., a hydroxyl-terminated polyethylene adipate, polyethylene-propylene adipate, polyethylenebutylene adipate, polybutylene adipate, polyethylene glycol, polypropylene glycol or polytetramethylene glycol with a hereinabove-mentioned organic polyisocyanate, e.g., tolylene diisocyanate, diphenylmethane diisocyanate, hexamethylene diisocyanate, isophorone diisocyanate or m-xylylene diisocyanate to synthesize an isocyanate-terminated prepolymer followed by reacting this with, say, either 2-hydroxyethyl methacrylate, 2-hydroxyethyl acrylate, 2-hydroxypropyl methacrylate, 2-hydroxypropyl acrylate, 2-hydroxy-3-chloro-propyl methacrylate or 2-hydroxy-3-chloropropyl acrylate.

The vinyl monomer used as one of the components of the photosensitive resin composition is a monomer whose radical polymerization is possible. Examples of the vinyl monomers are the monofunctional monomers such as styrene, acrylic acid, acrylamide, methacrylamide, diacetone acrylamide, vinyl acetate, vinyl butyrate and vinyl pyrrolidone, the polyethylene glycol diacrylates such as diethylene glycol diacrylate and triethylene glycol diacrylate, the polyethylene glycol dimethyacrylates such as diethylene glycol dimethacrylate and triethylene glycol dimethacrylate, and such compounds as polypropylene glycol diacrylate, polypropylene glycol dimethacrylate, trimethylolpropane triacrylate, trimethylolpropane trimethacrylate, pentaerythritol triacrylate, pentaerythritol trimethacrylate, methylenebisacrylamide, methylenebismethlacrylamide, divinyl succinate and divinyl adipate.

As the photopolymerization initiator, here can be mentioned, for example, the ketaldonyl compounds such as diacetyl and dibenzyl, the ketaldonyl alcohols such as benzoin and pivaloin, the acyloin ethers such as benzoin methyl ether and benzoin ethyl ether, the polynuclear quinones such as anthraquinone; and Michler's ketone and benzophenone.

A photosensitive resin composition containing at least 10% by weight based on the support of the present invention of the vinyl monomer, especially an arcylate or methacrylate compound, is particularly suitable for use in the present invention.

When the composition consisting of the above unsaturated polyurethane resin, crosslinking agent and sensitizer is exposed to actinic light, the crosslinking of the photosensitive resin occurs to form images.

When the photosensitive resin is laminated on the support of this invention and exposed to actinic light through a negative film bearing transparent images, the exposed area of the photosensitive resin polymerize and cure. When the laminate is then washed away with a wash-out solution, the unexposed areas are removed to form relief images. When actinic light is irradiated, the activating layer exhibits its function to activate that portion of the photosensitive resin which is near the support thereby to give a good shape to the relief image. This results in relief images having a frustoconical cross section with a broadened bottom, and therefore, the adhesive strength of the reliefs in lines and dots increases and no detachment of the images occurs.

The support of this invention is especially effective for liquid photosensitive resins. Previously, the liquid photosensitive resin have encountered the difficulty that a flow of the resin occurs in the unexposed portions as a result of shrinkage during a polymerization and crosslinking reaction, and consequently the bottom portion of the lines of the images are not sufficiently cured and the resulting relief images are unsatisfactory.

When the support of this invention having an activating layer formed thereon is used, the bottom portions of the lines are sufficiently activated, and good relief images can be formed by overcoming the flow of the resin. Especially effective liquid photosensitive resins are those composed mainly of unsaturated polyester resins, and those composed mainly of unsaturated polyurethane resins.

Printing plates having relief images obtained by using the support of this invention have superior resistance to printing and permit very firm adhesion between the relief images and the support. These printing plates can be directly used on a printing press, or can be utilized as a matrix for molding. They are especially useful as printing plates or matrices thereof having thick reliefs which are used, for example, for flexography, because undercuts in the support can be reduced.

The following Examples illustrate the present invention without any intention of limiting it.

All parts in the Examples are parts by weight.

The peel test (for adhesive strength) in the Examples was performed by means of an Instron tensile tester in the following manner.

An iron holder having a 0.4 mm-diameter slit and a space for allowing the entry of relief portions is fixed to the upper part of the Instron tensile tester. The sample is placed in the holder and its end is fixed to the lower part of the tester. Then, the sample is pulled at a speed of 0.2 cm/min. When the relief portions reach the end of the slit portion, they are caught by the edges at the slit end, and soon, the peeling of the reliefs occurs. The strength at this time is measured, and designated the adhesive strength.

EXAMPLE 1

A mixture of thioglycolic acid, adipic acid and diethylene glycol in a mol ratio of 1:1:2 was reacted at 200° C. for 5 hours in a stream of nitrogen to form a polyester having terminal mercapto groups.

7 Parts of the resulting polyester and 10 parts of cellulose acetate phthalate were dissolved in acetone to form a 10% solution. This coating solution was coated on an iron plate having an adhesive layer consisting of an epoxy resin and red lead, thereby to form an activating layer with a thickness of 3 microns.

On the other hand, 348 parts of tolylene diisocyanate and 1000 parts of polyethylene glycol with an average molecular weight of 1000 were reacted at 70° C. for one hour. After that, 286 parts of 2-hydroxyethylmethacrylate and 0.3 part of p-benzoquinone were added. The reaction was then carried out at 70° C. for 7 hours, whereby an unsaturated polyurethane resin prepolymer was obtained. With the addition to 70 parts of the resultant unsaturated polyurethane resin of 30 parts of tetraethylene glycol dimethacrylate and 1 part of benzoin ethyl ether was obtained a photosensitive resin composition. This resin composition was laminated on the aforesaid support and exposed through a negative film for 6 minutes using a fluorescent lamp. Then, the unexposed areas were washed away with a dilute aqueous alkali solution (0.5% conc.) to form relief images.

For comparison, relief images were produced in the same way as above except that the activating layer was absent on the support.

It was found that when the support of this invention is used, the shoulder angles of the lines and imagewise dots are good and the area of adhesion between the reliefs and the support is large. On the other hand, in the case of the comparison, the area of adhesion between the reliefs and the support is small and the reliefs contain undercuts.

When reliefs with a height of 0.7 mm were prepared using a negative film having imagewise dots with a diameter of 300 microns, the ratio of the diameter of the bottom of a relief to that of the top of the relief was 2.7 in the example of this invention, but 1.4 in the case of the comparison.

This shows that when the support of this invention is used, the reliefs have a frustoconical cross sectional shape with a broadened bottom to form a good shoulder form.

EXAMPLE 2

A mixture consisting of 2 mols of thiopropionic acid, 1 mol of adipic acid and 2 mols of diethylene glycol was polycondensed at 200° C. for 5 hours in an atmosphere of nitrogen to form a polyester having terminal mercapto groups.

10 Parts of hydroxypropylmethyl cellulose phthalate and 5 parts of the polyester obtained were dissolved in a thinner for epoxy resins. The resulting solution ws coated on supports consisting of a polyethylene terephthalate film and a polyurethane adhesive layer formed on it to form activating layers having a thickness of 0.1 micron, 3 microns, and 60 microns, respectively.

On the other hand, an unsaturated polyurethane resin synthesized by operating as in Example 1 but using instead of 348 parts of tolylene diisocyanate 336 parts of hexamethylene diisocyanate was made into a photosensitive resin composition with the same recipe as that used in Example 1. The so obtained resinous composition was laminated onto the hereinbefore-described support and exposed through a negative film having imagewise lines with a width of 100 microns and a length of 5 millimeters to form relief images with a height of 0.6 mm on the support.

In the case of the support which contained the activating layer in a thickness of 60 microns, adhesion at the 5% halftone dot highlight portion was poor, and the activating layer partly came off.

Relief line images with a width of 100 microns were produced in the same way as above, and the width of the relief at its base part was measured. The results are tabulated below.

| Thickness of the activating layer (microns) | With of reliefs (microns) |
| --- | --- |
| 0 | 500 |
| 0.1 | 510 |
| 3 | 780 |
| 60 | 790 |

COMPARATIVE EXAMPLE

Five moles of Epon 828 (an epoxy compound) having the formula

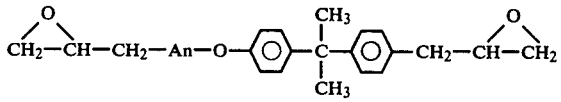

where A is

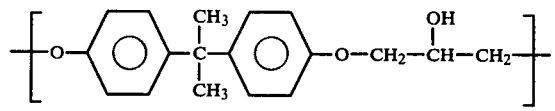

and n is a number greater than 0 and less than 1 and having an average value such that the average molecular weight of the epoxy compound is about 390 and twelve moles of diallylamine were admixed under an atmosphere of nitrogen and maintained at about 80°–90° C. (under said atmosphere of nitrogen) for 2–3 hours. Then unreacted diallylamine was distilled off under reduced pressure (ca. 1–10 mm. of mercury absolute) and the residue was recovered. This is designated "Polyene A".

A composition was prepared by admixing the "Polyene A" and pentaerythritol tetra-beta-mercaptopropionate in a mole ratio of 1:1 to form a first mixture. The first mixture was admixed with about 0.1% by weight of dibenzosuberone and 2.5% by weight of acrylic acid.

The resulting mixture was then coated on the support of Example 2 in place of the activating layer of Example 2, after which a printing plate was prepared by lamination onto the coated support of a photosensitive resin layer as in Example 2. The performance of the printing plate was evaluated with the following results.

| Thickness of the activating layer (microns) | Width of reliefs (microns) |
|---|---|
| 0 | 500 |
| 3 | 500 |

It can be seen from the foregoing results that the Polyene A-mercapto compound-acrylic acid mixture does not possess the effects of the activating layer of the present invention.

EXAMPLE 3

An unsaturated polyurethane photosensitive resin was synthesized by operating as in Example 1 but using instead of polyethylene glycol 1600 parts of a hydroxyl-terminated polybutylene adipate of an average molecular weight of 1000. A support for the photosensitive resin consisting of polyethylene terephthalate film having a layer of a polyurethane adhesive formed thereon was coated with a solution for forming an activating layer obtained as in Example 1 to form a 2.5-micron-thick activating layer thereon. A layer of the foregoing photosensitive resin was then laminated thereon and exposed through a negative film having a 100-micron-wide × 5-mm-long transparent image for 8 minutes using a 60-watt fluorescent lamp to form on the foregoing support a relief image having a height of 0.55 mm. A peel test was conducted with an Instron tension tester. By way of comparison, a relief image was formed in the same manner as described hereinabove but using a support not having an activating layer. A peel test of this was also conducted.

| Experiment | Adhesive strength (kg) |
|---|---|
| Example 5 | 6.4 |
| Control | 4.1 |

EXAMPLE 4

A mixture of 424 parts of diethylene glycol, 292 parts of adipic acid and 116 parts of fumaric acid was polycondensed under reduced pressure for 9 hours at 210° C. to synthesize a hydroxyl-terminated unsaturated polyester. 700 Parts of the so obtained unsaturated polyester was reacted with 87 parts of tolylene diisocyanate for 3 hours at 100° C. to synthesize an unsaturated polyester urethane.

A photosensitive resin was then prepared by adding 6 parts of methacrylamide, 34 parts of tetramethylene glycol dimethacrylate and 1.0 part of benzoin methyl ether to 60 parts of the foregoing polyester urethane.

A layer of the so obtained photosensitive resin was then laminated onto a support of the same type as that used in Example 1. The resulting support was exposed through a negative film having a transparent image 100 micron in width and 5 mm long for 6 minutes using a 60-watt fluorescent lamp to form on the support a relief image having a height of 0.55 mm. By way of comparison, a relief image was prepared in like manner but using a support not having an activating layer. These relief images were then tested as in Example 3, with the following results.

| Experiment | Adhesive strength (kg.) |
|---|---|
| Example 4 | 8.1 |
| Control | 5.4 |

We claim:

1. A process for preparing a relief printing plate which comprises

I. depositing (D) a liquid photosensitive resin layer on the surface of an activating layer which is the uppermost layer of a multi-layered support, said support comprising, in order (A) a base plate, (B) an adhesive layer and (C) the activating layer, II. exposing the photosensitive resin layer to actinic light through a negative film bearing transparent images to polymerize and cure the exposed area of the photosensitive resin, and III. washing away the uncured portion of the photosensitive resin with a wash-out solution to remove the uncured portion of the photosensitive resin and to thereby form a relief image having a frustoconical cross section with a broadened bottom as a result of said activating layer promoting the curing of the photosensitive layer nearest the support and in contact with the activating layer, said activating layer (C) consisting essentially of (1) from 0.05 to 2 parts by weight of a compound selected from at least one member of the group consisting of:

(a) at least one ester containing at least one mercapto group, which is the condensation product of (i) a first reactant containing at least one mercapto group bonded to an aliphatic carbon and which is a thiocarboxylic acid or thioalcohol, with, (ii) a second reactant selected from at least one of the polycarboxylic acid and polyglycol, and (b) one part by weight of a linear polymer binder which is soluble in an organic solvent; and the photosensitive resin layer (D) consisting essentially of:

(1) at least one unsaturated polyurethane resin selected from the group consisting of an unsaturated polyurethane resin obtained by reacting a hydroxyl-terminated unsaturated polyester with an organic polyisocyanate and an unsaturated polyurethane resin obtained by reacting a reaction product of a hydroxylterminated polyester or polyether and an organic polyisocyanate, with a compound of the formula

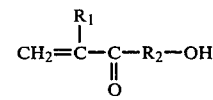

wherein $R_1$ is selected from the group consisting of hydrogen and methyl, and $R_2$ represents

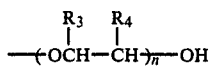

where $R_3$ and $R_4$ are each selected from the group consisting of hydrogen and an alkyl group of 1-3 carbon atoms, which may be substituted by a halogen,
(2) a vinyl monomer, and
(3) a photopolymerization initiator.

2. The process of claim 1 wherein the activating layer (B) has a thickness of 0.1 to 50 microns.

3. The process of claim 1 wherein the total amount of said mercapto-containing compound (1) (a) and aromatic tertiary amine (1) (b) is 0.05 to 2 times the weight of said polymer binder.

4. The process of claim 1 wherein said compound (1) is said aromatic tertiary amine (1) (b) which is a tertiary amine derived from aniline or toluidine.

5. The process of claim 1 wherein said polymer binder (2) is a polymer containing a carboxyl group and being soluble in alkali aqueous solutions.

6. The process of claim 1 wherein said adhesive layer (B) is also an anti-halation layer.

* * * * *